United States Patent
Shimada

(10) Patent No.: US 6,667,501 B2
(45) Date of Patent: Dec. 23, 2003

(54) NONVOLATILE MEMORY AND METHOD FOR DRIVING NONVOLATILE MEMORY

(75) Inventor: Yasuhiro Shimada, Muko (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/168,003

(22) PCT Filed: Dec. 13, 2000

(86) PCT No.: PCT/JP00/08834

§ 371 (c)(1),
(2), (4) Date: Jun. 14, 2002

(87) PCT Pub. No.: WO01/45161

PCT Pub. Date: Jun. 21, 2001

(65) Prior Publication Data

US 2002/0190296 A1 Dec. 19, 2002

(30) Foreign Application Priority Data

Dec. 14, 1999 (JP) .............................. 11-354324

(51) Int. Cl.[7] .............................................. H01L 29/76
(52) U.S. Cl. .................................................... 257/295
(58) Field of Search ................................ 257/290–310

(56) References Cited

U.S. PATENT DOCUMENTS 5,466,629 A * 11/1995 Mihara et al.
5,753,946 A * 5/1998 Naiki et al. ................. 257/295

FOREIGN PATENT DOCUMENTS

JP          4-99365          3/1992

* cited by examiner

*Primary Examiner*—Abraham Fetsum
(74) *Attorney, Agent, or Firm*—Merchant & Gould P.C.

(57) ABSTRACT

A memory cell includes a MOS transistor having a source region, a drain region and a gate electrode, a ferroelectric film formed on the source region of the MOS transistor via an insulating film and an electrode formed on the ferroelectric film. The memory cell can be composed of a smaller number of elements while preventing data corruption and disturbance at the time of readout.

4 Claims, 5 Drawing Sheets

NONVOLATILE MEMORY AND METHOD FOR DRIVING NONVOLATILE MEMORY

TECHNICAL FIELD

The present invention relates to a nonvolatile memory device and a method for driving the same.

BACKGROUND ART

As one example of a nonvolatile memory device, those which use a field effect transistor including a ferroelectric film in a gate (hereinafter, referred to as a "ferroelectric FET") have been proposed. The ferroelectric FET has a ferroelectric film and a gate electrode on a switching MOS-FET to form a nonvolatile memory device. As shown in FIG. 6, the ferroelectric FET is configured by successively forming an insulating film 13, a ferroelectric film 12 and a gate electrode 14 on a substrate 8 where a source region 5 and a drain region 6 are formed.

In the above-mentioned configuration, the ferroelectric film 12 may be polarized upward or downward. Assuming that the threshold voltage of the MOS-FET can be set at either of two different values corresponding to the two polarization states, the set state can be held (stored) as long as the polarization state of the ferroelectric film 12 is held. As shown in FIG. 7, a word line W is connected to the gate of the transistor, a bit line B to the drain region, and a source region line S to the source region, thereby configuring a memory cell as an element at each intersection of a matrix array.

The matrix array of the conventional nonvolatile memory device composed of the above-described memory cells has a configuration as shown in FIG. 8, for example. In FIG. 8, M11, M12, M21 and M22 denote a transistor, respectively, which constitutes each memory cell, C11, C12, C21 and C22 at each intersection of the matrix array. W1 denotes a word line connected to each gate of the transistors M11 and M12. W2 denotes a word line connected to each gate of the transistors M21 and M22. S1 denotes a source region line connected to each source region of the transistors M11 and M12. S2 denotes a source region line connected to each source region of the transistors M21 and M22. B1 denotes the bit line connected to each drain region of the transistors M11 and M21. B2 denotes a bit line connected to each drain region of the transistors M12 and M22.

The logic state of a memory cell is distinguished depending upon whether the transistor M11, M12, M21 or M22 of the selected memory cell is in an ON or OFF state. Whether the transistor is in an ON or OFF state is determined depending upon whether a channel under the gate of the transistor is conducting or not. A gate voltage, by which the channel of the transistor is conducted when applied to the gate of the transistor, that is, a threshold voltage, can be separated corresponding to the two polarization states of the ferroelectric film. For instance, a gate and a channel can be configured so that the transistor is turned ON in one polarization state, while the transistor is turned OFF in the other polarization state when a voltage is applied to the gate. Then, a logic of the transistor in the ON state is defined as "1", and that in the OFF state is defined as "0", for example.

In order to find a logic held in, for example, the memory cell C11 in FIG. 8, on the basis of the above definition, the following operation should be conducted. First, the bit line B1 is discharged to a low voltage. Then, the voltage of the source region line S1 is increased to a readout voltage. Thereafter, the intermediate voltage between the above-described two threshold voltages is applied to the word line W1. When the ferroelectric film of the transistor M11 is in a low threshold voltage state (i.e., "1"), the transistor M11 is turned ON. Consequently, an electric current flows from the source region line S1 to the bit line B1, whereby the bit line B1 is charged, and the voltage thereof is increased. On the other hand, when the ferroelectric film of the transistor M11 is in a high threshold voltage state, (i.e., "0"), the transistor M11 is turned OFF. Consequently, the bit line B1 is not charged, and the voltage thereof remains low. Therefore, the logic state held in the desired memory cell can be distinguished depending upon the high or low state of the voltage of the bit line B1.

However, in the case where a voltage is applied to the word line W1 or W2 every time data are read out, the ferroelectric film of the gate in the state "0" is applied with a voltage in a direction gradually approaching the state "1", even when the value of the voltage is intermediate between the two threshold voltages corresponding to the above-mentioned polarization states of the ferroelectric film. As a result, all the ferroelectric films connected to the word line, to which the readout voltage is applied and which are in the state "0", gradually approach the state "1", every time data is read out. Accordingly, it gradually becomes difficult to discriminate the state between "0" and "1", that is, a so-called disturbance occurs.

In order to avoid such a problem, the transistor may be designed to be set in either an enhancement state or a depletion state in accordance with the polarization state of the ferroelectric film. When the respective states are brought into correspondence with the two logic values, it is not required to apply a voltage to the word line at the time of readout.

However, the depletion-type transistor is a normally-on type, that is, in the state "1", even when the gate voltage is zero. Therefore, the following problem might arise.

When the logic held in a non-selected memory cell is "1", a current path from the bit line to the source line is formed via the non-selected memory cell. Then, the potential of the bit line might be varied in accordance with the state of the non-selected memory cell. To avoid this, a transistor for connecting only the transistor of the selected memory cell to the bit line is required to be added to the memory cell.

Further, in order to selectively write data only onto the transistor of a randomly selected memory cell, the substrate of the ferroelectric FET of each memory cell should be separated electrically by a well at least from the substrate of the ferroelectric FET of the memory cell connected to the adjacent word line or bit line. To solve this problem, it is necessary to add a selecting transistor to the gate of the transistor.

When the ferroelectric FETs as memory cells are arranged in a matrix in accordance with the above-described measures, a configuration as shown in FIG. 9 is obtained. According to this configuration, it is required to provide selecting transistors TP and TB between a ferroelectric FET (M) and a word line WP, and between the ferroelectric FET (M) and a bit line B, respectively. Therefore, there arises the disadvantage that the memory cell is increased in size by several times that of a memory cell having one transistor and one capacitor (1C-1Tr memory cell).

DISCLOSURE OF THE INVENTION

Therefore, with the foregoing in mind, it is an object of the present invention to provide a nonvolatile memory device that prevents data corruption and disturbance when the data is read out from a memory cell, and in which a memory cell is composed of a smaller number of elements, and a method for driving the same.

To solve the above-described problems, a nonvolatile memory device of the present invention includes a MOS transistor having a source region, a drain region and a gate electrode, a ferroelectric film formed on the source region via an insulating film, and an electrode formed on the ferroelectric film. According to this configuration, the polarization state of the ferroelectric film formed on the source region affects the quantity of flow of electrons injected to a channel in a direction from the source region to the drain region of the MOS transistor, whereby the logic state held in the memory cell can be distinguished. In this configuration, since a voltage applied to the gate electrode at the time of readout has no influence on the ferroelectric film, the data corruption and disturbance at the time of readout of data from the memory cell can be avoided. Further, a nonvolatile memory device constituted by a memory cell composed of a smaller number of elements can be obtained.

In the above-configured nonvolatile memory device, it is preferable that the insulating film composed of a plurality of layers is formed between the source region of the MOS transistor and the ferroelectric film. This configuration can prevent a direct contact between the surface of the channel and the ferroelectric film and inhibit oxidation at the interface of the source region during growth of crystal of the ferroelectric film.

Further, the nonvolatile memory device of the present invention can be configured so as to have memory cells arranged in a matrix, each unit of the memory cell including a MOS transistor having a source region, a drain region and a gate electrode, a ferroelectric film formed on the source region via an insulating film, and an electrode formed on the ferroelectric film. This configuration allows a memory unit (memory cell) to be randomly selected and data to be read from or written to the memory cell without the non-selected memory being read out irrespective of the enhancement-type or the depletion-type transistor.

Further, a method for driving a nonvolatile memory device of the present invention is the one for driving a nonvolatile memory device including a MOS transistor having a source region, a drain region and a gate electrode, a ferroelectric film formed on the source region via an insulating film and an electrode formed on the ferroelectric film. According to this method, the polarization state of the ferroelectric film can be detected based on the quantity of flow of electrons injected from the source region to the drain region via the channel under the gate electrode, under the application of a bias voltage, by which the drain region becomes positive, to the source region. This method allows the quantity of flow of electrons injected from the source region to the drain region of the MOS transistor to be reflected by the polarization state of the ferroelectric film formed on the source region. Therefore, the logic state held in the memory cell can be distinguished.

BEST MODE FOR CARRYING OUT THE INVENTION

Hereinafter, the nonvolatile memory device according to an embodiment of the present invention will be described with reference to FIGS. 1 to 5.

Figure 1:
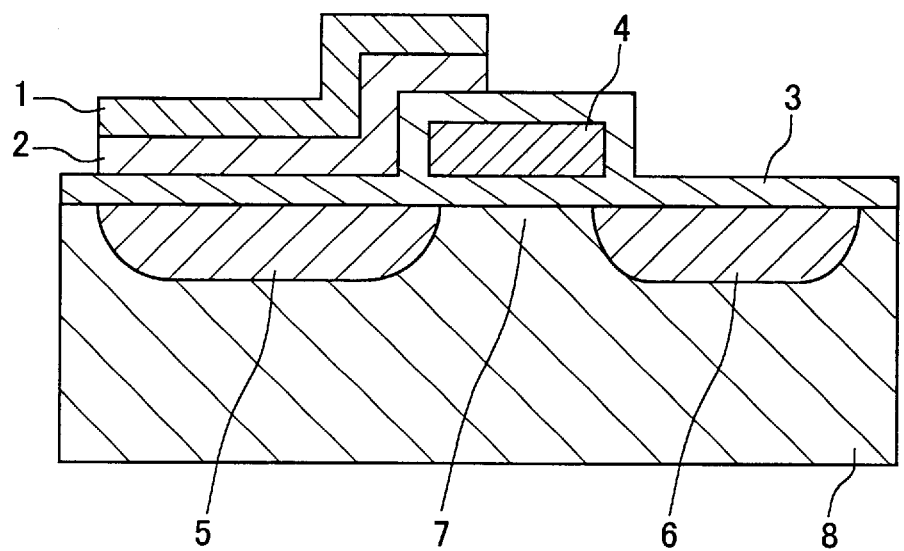
FIG. 1 is a cross-sectional view of a ferroelectric FET constituting a nonvolatile memory device according to an embodiment of the present invention.

FIG. 1 shows a ferroelectric FET constituting the nonvolatile memory device according to an embodiment of the present invention. A switching MOS-FET transistor is formed by providing an insulating film 3 on a silicon substrate 8 where a source region 5 and a drain region 6 are formed, and further providing a gate electrode 4. A ferroelectric film 2 and an electrode 1 are formed on the insulating film 3 covering the gate electrode 4 so as to be superimposed on the source region 5 and a portion of the gate electrode 4.

The insulating film 3 is composed of an oxide film or nitride film made of silicon oxide, silicon nitride or silicon oxynitride; a metal oxide with a high dielectric constant; or the like. Further, the insulating film 3 may be composed of plural layers of different materials. The gate electrode 4 is composed of metal such as doped polysilicon, aluminum, copper or the like. The ferroelectric film 2 is composed of a metal oxide such as bismuth-strontium-tantalum oxide or the like.

Figure 2:
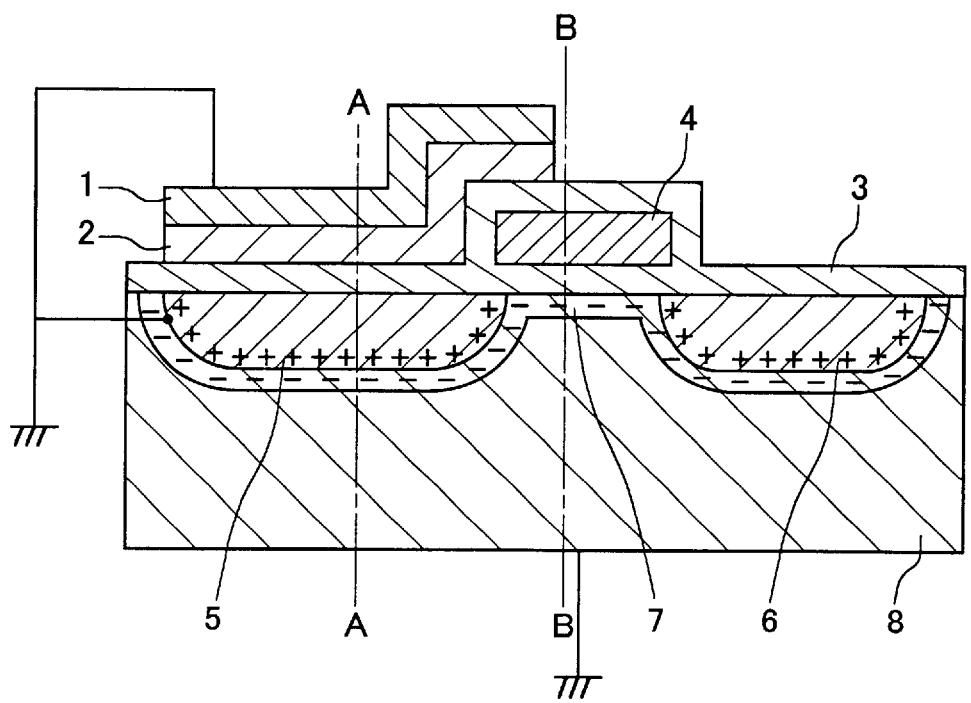
FIG. 2 is a cross-sectional view illustrating an operation of the ferroelectric FET in FIG. 1.
Figure 3A:
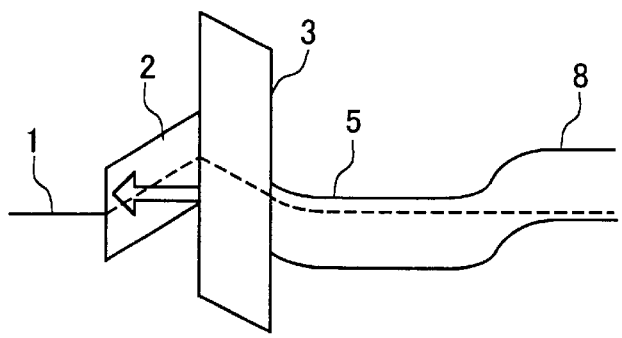
FIGS. 3A and 3B are views showing the energy band in a cross section of the ferroelectric FET taken along a line A—A in FIG. 2.
Figure 3B:
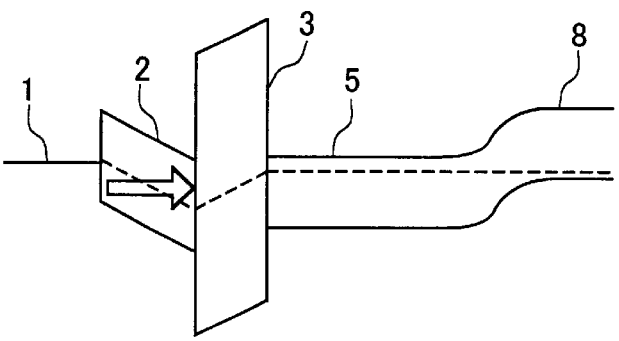

In the following description, an example will be described in which the substrate 8 is made of P-type silicon, and the source region 5 and the drain region 6 are doped to be an N-type. In this configuration, the ferroelectric film 2 is polarized upward or downward in advance by using a circuit connected between the electrode 1 and the source region 5. Thereafter, as shown in FIG. 2, the electrode 1, the source region 5 and the substrate 8 are grounded. In this state, a cross section taken along a line A—A is in a thermal equilibrium state irrespective of whether the ferroelectric film 2 is polarized upward or downward. FIGS. 3A and 3B show the energy band in the cross section taken along the line A—A in this state. Reference numerals in FIGS. 3A and 3B correspond to the substrate 8, the source region 5, the insulating film 3, the ferroelectric film 2 and the electrode 1 that constitute the ferroelectric FET in FIG. 2, respectively.

The direction of an arrow in FIGS. 3A and 3B indicates the direction of the polarization of the ferroelectric film 2. FIG. 3A corresponds to the case where the polarization is directed upward. FIG. 3B corresponds to the case where the polarization is directed downward. According to the comparison between these figures, it can be found that the potential at the interface between the insulating film 3 and the source region 5 is varied depending upon the direction of the polarization. More specifically, when the polarization is directed upward, the potential of the source region 5 under the insulating film 3 is elevated by a polarization charge. On the other hand, when the polarization is directed downward, the potential of the source region 5 under the insulating film 3 remains flat.

Figure 4:
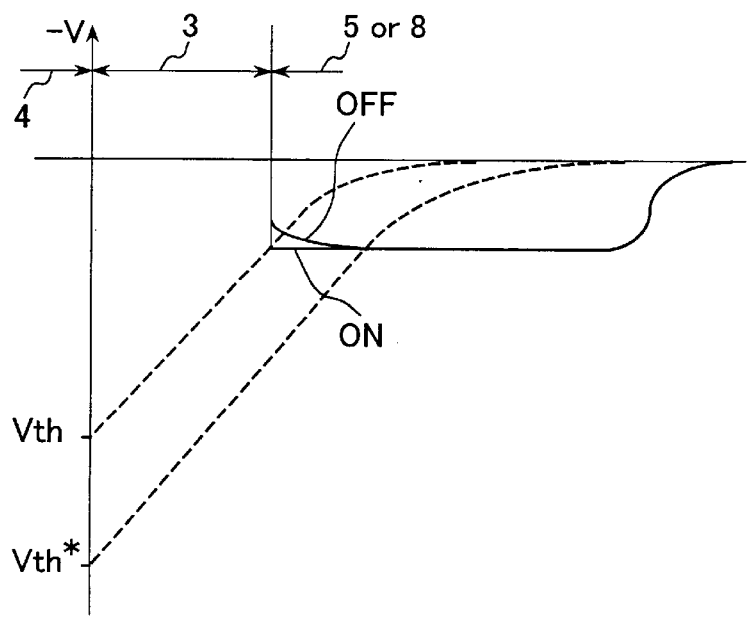
FIG. 4 is a view showing that two potential distributions are overlapped: the distribution in an area crossing from the ferroelectric film on the source region to the substrate and that in an area crossing from the gate to the substrate in the ferroelectric FET in FIG. 1.

FIG. 4 shows that two potential distributions corresponding to two polarization states are overlapped with each other: the distribution in the cross section of the source region 5 taken along the line A—A and that in the cross section from the gate electrode 4 of the MOS transistor to a channel 7 taken along a line B—B in FIG. 2. More specifically, FIG. 4 is a view showing the potentials of the gate electrode 4, the insulating film 3, and the source region 5 or the substrate 8. The potential distribution in the cross section taken along the line A—A is represented by a solid line, and that taken along the line B—B is represented by dashed lines. Two potential distributions represented by the dashed lines correspond to the case where the potential of the gate electrode 4 is Vth and to the case where the potential of the gate electrode 4 is Vth*, respectively.

In the cross section taken along the line A—A, the potential of the source region 5 in the vicinity of the interface between the insulating film 3 and the source region 5 is elevated high when the polarization is directed upward (i.e., in the case of FIG. 3A). On the other hand, the potential remains flat when the polarization is directed downward, (i.e., in the case of FIG. 3B). Therefore, the case of FIG. 3A is defined as an "OFF state" (i.e., "0"), while the case of FIG. 3B is defined as an "ON" state (i.e., "1").

In order for electrons to flow from the source region 5 to the channel 7, a bias is applied between the source region 5 and the drain region 6 so that the drain region 6 becomes positive, to increase the potential of the gate electrode 4. In the case where the source region 5 is in an ON state, when the potential of the gate electrode 4 increases to reach Vth in FIG. 4, the potential of the source region 5 becomes equal to that of the channel 7 under the gate. Then, electrons start to flow from the source region 5 to the channel 7. In the case where the source region 5 is in an OFF state, the lowest portion of the potential of the source region 5 is not matched with the potential of the channel 7 until the potential of the gate electrode 4 reaches Vth*. Accordingly, if the potential of the gate electrode 4 is set in a range from Vth to Vth*, the direction of the polarization can be distinguished depending on whether or not the electrons are injected from the source region 5 to the channel 7.

As described above, there is a difference in the quantity of electrons flowing from the source region 5 to the channel 7 between an ON state and an OFF state. Therefore, when the potential of the gate electrode 4 is set in the range where the difference in the quantity of flow of electrons occurs and a bias voltage is applied to the source region 5 so that the drain region 6 becomes positive, the difference appears in the quantity of electrons flowing from the source region 5 to the drain region 6 via the channel 7 under the gate electrode 4. Thus, the logic state held in the memory cell can be distinguished between "0" and "1" by detecting the polarization state of the ferroelectric film 2.

Further, since the ferroelectric film 2 is formed on the source region 5, even when a voltage is applied to the gate electrode 4 of the MOS transistor to select a memory cell, the polarization state of the ferroelectric film 2 is not influenced by the applied gate voltage. Thus, the occurrence of disturbance can be avoided.

In the embodiment of the present invention, the ferroelectric film 2 is formed on the source region 5 and a portion of the gate electrode 4. However, the ferroelectric film 2 may be formed only on the source region 5, or only on a portion of the source region 5.

Since the insulating film 3 is provided between the source region 5 and the ferroelectric film 2, when the ferroelectric film 2 is formed, the interface of the source region 5 can be prevented from oxidation that might occur during the growth of crystal of the ferroelectric film.

Figure 5:
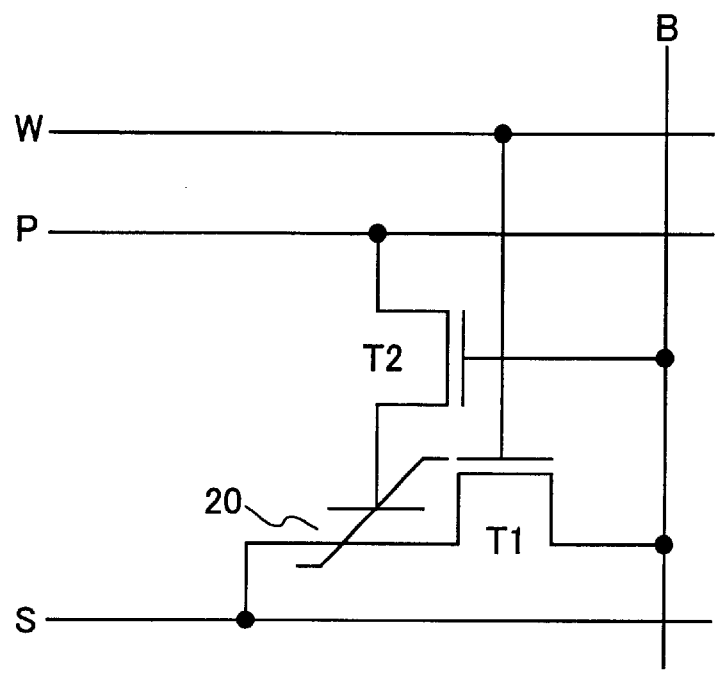
FIG. 5 is a circuit diagram showing a memory cell using the ferroelectric FET in FIG. 1.
Figure 6:
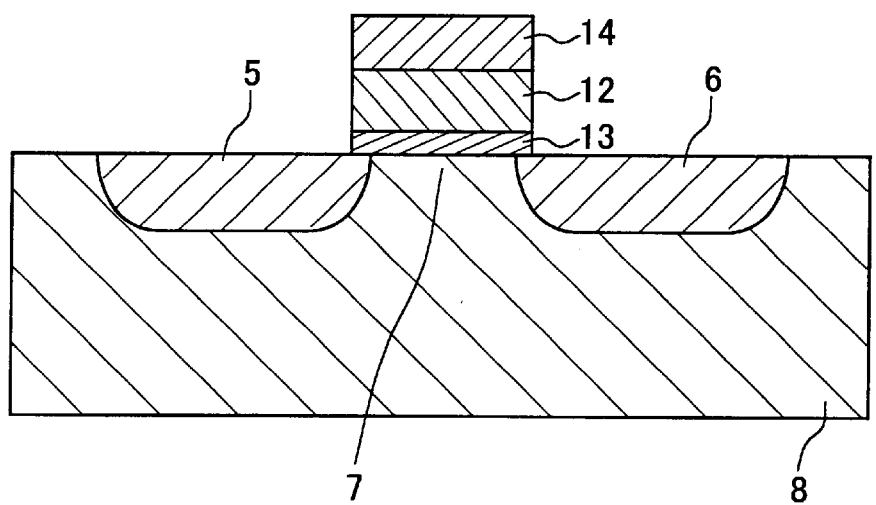
FIG. 6 is a cross-sectional view of a conventional ferroelectric FET.
Figure 7:
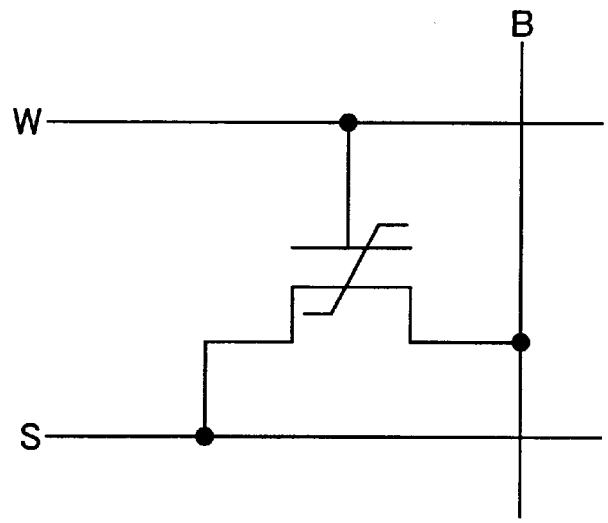
FIG. 7 is a circuit diagram showing a memory cell using the ferroelectric FET in FIG. 6.
Figure 8:
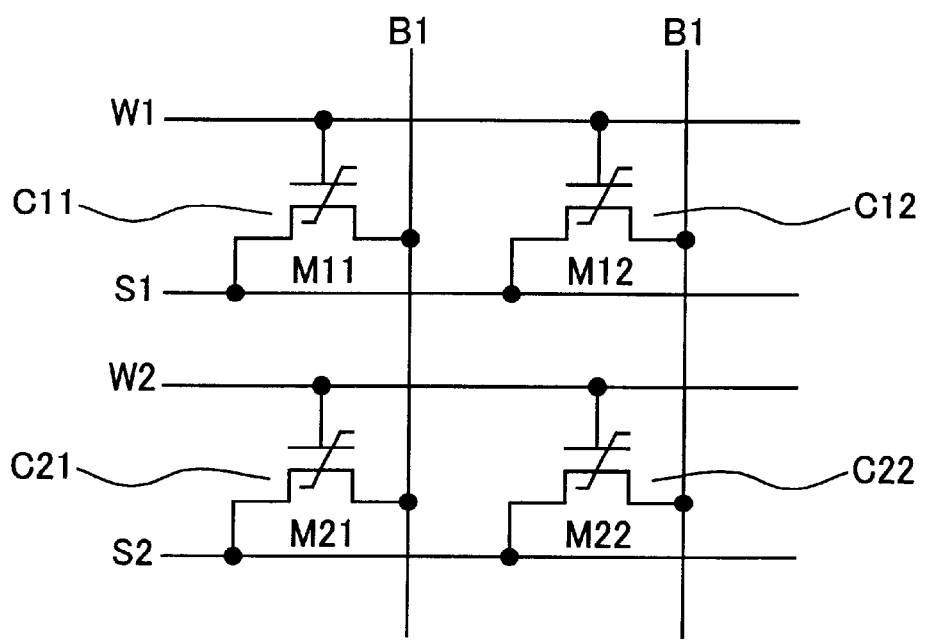
FIG. 8 is a circuit diagram showing a conventional nonvolatile memory device in which the memory cells in FIG. 7 are arranged in a matrix array.

The nonvolatile memory device of the embodiment of the present invention is configured by arranging the memory cells as shown in FIG. 5, which employ the foregoing ferroelectric FET as a memory unit in a matrix.

The memory cell in FIG. 5 includes a first MOS transistor T1 and a second MOS transistor T2. The first MOS transistor T1 is the foregoing ferroelectric FET, that is, a MOS transistor composed of the ferroelectric film formed on the source region. Reference numeral 20 denotes a ferroelectric capacitor composed of the ferroelectric film. The gate of the first MOS transistor T1 is connected to a word line W, the drain region to a bit line B and the source region to a source line S. The electrode 1 (see FIG. 1) of the ferroelectric capacitor 20 is connected to a program line P via the second MOS transistor T2, and the gate of the second MOS transistor T2 to the bit line B.

Figure 9:
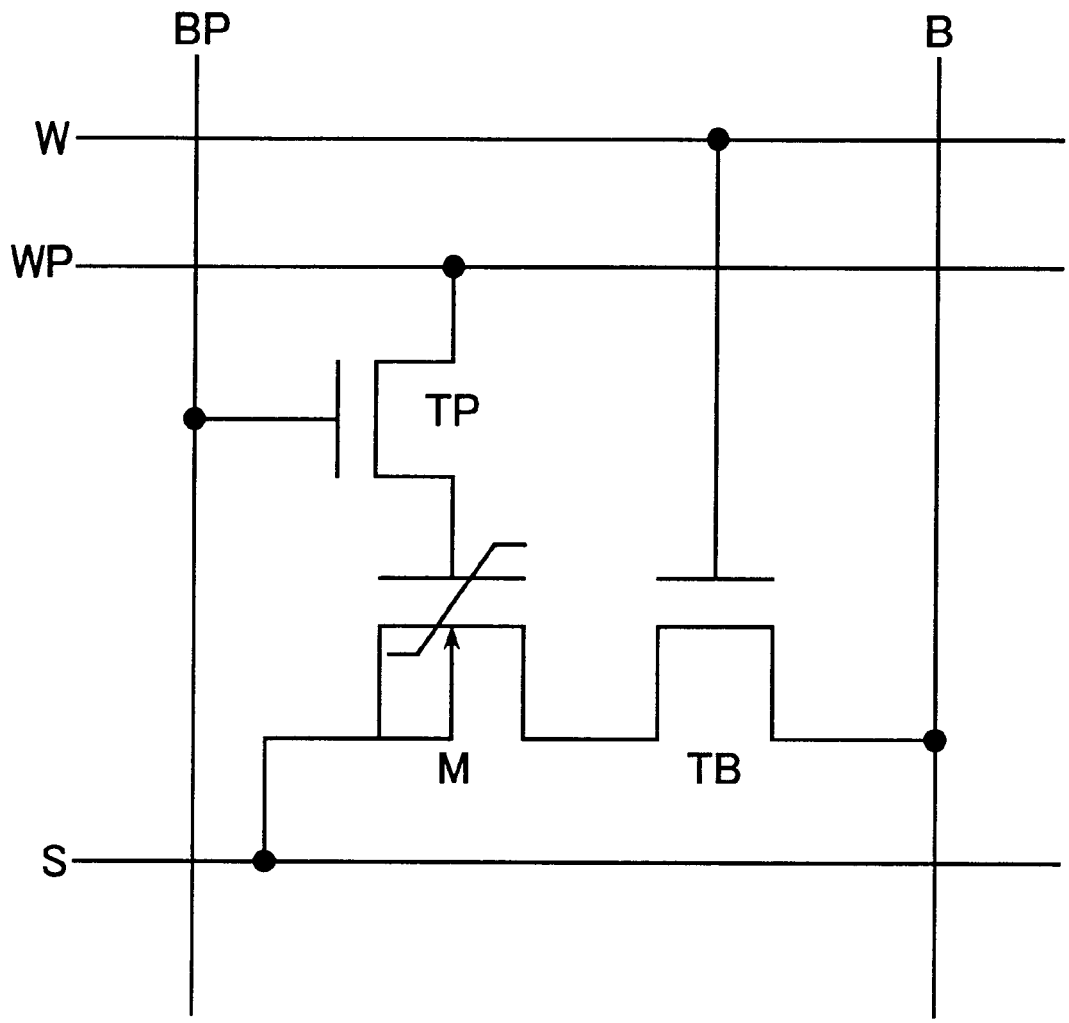
FIG. 9 is a circuit diagram showing a configuration in which a selecting transistor is added to the ferroelectric FET in the memory cell in FIG. 7.

As described above, the memory cell according to the present embodiment has a reduced number of elements as compared with the prior art in FIG. 9. More specifically, the ferroelectric FET (M) in FIG. 9 is required to be provided with selecting transistors TB and TP. In contrast, according to the present embodiment, it is not required to add a transistor equivalent to the selecting transistor TB. Further, as described in the following, the memory cell of the present invention can be operated similarly to the memory cell of the prior art in FIG. 9.

Hereinafter, a method for driving the memory cell in FIG. 5 will be described in the case where the memory cells are arranged in a matrix. Here, the first MOS transistor T1 in the memory cell corresponds to the enhancement type or depletion type.

At the time of readout of the memory cell in FIG. 5, first, all the lines are set at a low voltage (e.g., ground voltage). Then, a high voltage between Vth and Vth* is applied to the word line. Subsequently, when the bit line B is set at a high voltage, an electric current does not flow to the source line S when the polarization is directed upward (OFF), while an electric current flows to the source line S when the polarization is directed downward (ON).

In the case where a plurality of memory cells which perform the readout operation as described above are arranged in a matrix, if each of the word lines of the non-selected memory cells connected to the common bit line B is set at a low voltage, each of the MOS transistors of the non-selected memory cells is in a high-impedance state. Therefore, the state of only the selected memory cell can be detected by the potential of the bit line B or that of the source line S. Further, even when the word line W is set at a high voltage at the time of readout, the voltage is not applied to the ferroelectric capacitor 20. Therefore, the polarization state is not influenced.

Data can be erased from a desired memory cell (the source potential can be turned OFF) as follows. The program line P is set at a low voltage, and the word line is retained at a low voltage. Under this condition, the bit line is set at a high voltage to turn on the second MOS transistor T2.

Consequently, the ferroelectric capacitor 20 and the program line P are connected to each other electrically. Next, the source line S is set at a high voltage. Thereby, a voltage equal to or higher than that which reverses the polarization state of the ferroelectric capacitor 20 is applied between the program line P and the source line S.

Data can be written onto a desired memory cell (the source potential can be turned ON) as follows. The word line W is set at a low voltage. Under this condition, the bit line B is set at a high voltage to turn on the second MOS transistor T2. Consequently, the ferroelectric capacitor 20 and the program line P are connected to each other electrically. Next, the source line S is set at a low voltage, and the program line P is set at a high voltage. Thereby, a voltage equal to or higher than that which reverses the polarization state of the ferroelectric capacitor 20 is applied between the program line P and the source line S.

As described above, in the case where the memory cell in FIG. 5 is arranged in a matrix, irrespective of whether the first MOS transistor T1 is of an enhancement type or a depletion type, a current path to the bit line B is not formed due to the non-selected memory cell. Therefore, data of only the selected memory cell can be obtained. Accordingly, the memory cell according to the embodiment of the present invention can be composed of a smaller number of elements, while conducting an operation equal to that of the conventional memory cell composed of the ferroelectric FET and the selecting transistors TP and TB.

Further, in the case where the memory cells according to the embodiment of the present invention are arranged in a matrix, a binary logic state can be stored only in a selected memory cell corresponding to whether or not the polarization is directed upward. The stored logic state can be distinguished by being read out as long as the spontaneous polarization is maintained.

INDUSTRIAL APPLICABILITY

According to the present invention, by using the property that the quantity of electrons flowing from a source region, on which a ferroelectric film of a MOS transistor is superimposed, to a channel depends upon the polarization state of a ferroelectric film, the polarization state of the ferroelectric film, that is, data of a memory cell can be distinguished by a simple configuration and procedure. Further, since the polarization state is spontaneous, the polarization state can be held (stored), and the state can be reflected to a channel current of a transistor (read out). Therefore, the effect of the ferroelectric memory can be possessed.

The ferroelectric film is formed on the source region. Therefore, even when a voltage is applied to the gate of the MOS transistor in order to select a memory cell, the gate voltage does not affect the polarization state of the ferroelectric film, and hence, disturbance can be avoided.

In the nonvolatile memory device composed of the memory cells employing the ferroelectric FET, the selecting transistor is not required to be added to the word line and the bit line in each memory cell. Therefore, the memory cell is not increased in the size, and hence, the integration can be facilitated.

What is claimed is:

1. A nonvolatile memory device comprising a memory cell including a MOS transistor having a source region, a drain region and a gate electrode, a ferroelectric film formed on the source region via an insulating film, and an electrode formed on the ferroelectric film, wherein the insulating film is composed of a plurality of layers.

2. A nonvolatile memory device comprising memory cells each including a first transistor and a second transistor, the first transistor being provided with a ferroelectric film and an electrode on a source region, wherein a gate, a drain region and a source region of the first transistor are connected to a word line, a bit line and a source line, respectively;

the electrode formed on the ferroelectric film is connected to a program line via the second transistor; and a gate of the second transistor is connected to the bit line.

3. The nonvolatile memory device according to claim 1 or 2, wherein the memory cells are arranged in a matrix.

4. A method for driving a nonvolatile memory device comprising a MOS transistor having a source region, a drain region and a gate electrode, a ferroelectric film formed on the source region via an insulating film, and an electrode formed on the ferroelectric film, the method comprising:

applying a bias voltage to the source region so that the drain region becomes positive; and detecting a polarization state of the ferroelectric film depending upon a quantity of flow of electrons injected from the source region to the drain region via a channel under the gate electrode.

* * * * *